US012787745B2

(12) United States Patent
Ma et al.

(10) Patent No.: US 12,787,745 B2

(45) Date of Patent: Nov. 3, 2026

(54) VIA GROUND STRUCTURES

(71) Applicant: Cisco Technology, Inc., San Jose, CA (US)

(72) Inventors: Wenbin Ma, Shanghai (CN); Mike Sapozhnikov, San Jose, CA (US); Weiying Ding, Shanghai (CN); David Nozadze, San Jose, CA (US); Yinxin Yang, Shanghai (CN)

(73) Assignee: CISCO TECHNOLOGY, INC., San Jose, CA (US)

( * ) Notice: Subject to any disclaimer, the term of this patent is extended or adjusted under 35 U.S.C. 154(b) by 551 days.

(21) Appl. No.: 18/304,001

(22) Filed: Apr. 20, 2023

(65) Prior Publication Data

US 2024/0355737 A1 Oct. 24, 2024

(51) Int. Cl.

| | |
|---|---|
| ***H10W 20/41*** | (2026.01) |
| ***H10W 20/00*** | (2026.01) |
| ***H10W 20/20*** | (2026.01) |
| ***H10W 72/00*** | (2026.01) |

(52) U.S. Cl.

CPC ....... *H10W 20/427* (2026.01); *H10W 20/023* (2026.01); *H10W 20/20* (2026.01); *H10W 72/823* (2026.01)

(58) Field of Classification Search

CPC ........... H01L 23/5286; H01L 21/76898; H01L 23/481; H01L 2225/06548; H10W 20/427; H10W 20/0238–0265; H10W 20/211–218

See application file for complete search history.

(56) References Cited

U.S. PATENT DOCUMENTS

| | | | | |
|---|---|---|---|---|
| 10,595,394 | B1 * | 3/2020 | Kim | H05K 1/113 |
| 2006/0110848 | A1 | 5/2006 | Brown | |
| 2011/0232955 | A1 | 9/2011 | Morgan | |
| 2018/0376590 | A1 | 12/2018 | Xiong | |
| 2024/0222888 | A1 * | 7/2024 | Cao | H05K 1/112 |

FOREIGN PATENT DOCUMENTS

| | | | | |
|---|---|---|---|---|
| CN | 115810937 A | * | 3/2023 | H05K 3/3405 |

OTHER PUBLICATIONS

Junda Wang, "SerDes channel crosstalk mitigation methodology with industrial implementation guidance," Missouri S&T Library and Learning Resources, Master Theses, https://scholarsmine.mst.edu/masters_theses/7936, Year: 2020, 66 pages.

"Microvia," Wikipedia, https://en.wikipedia.org/wiki/Microvia, retrieved from the Internet Apr. 20, 2023, 3 pages.

* cited by examiner

*Primary Examiner* — Amar Movva

(74) *Attorney, Agent, or Firm* — Edell, Shapiro & Finnan, LLC

(57) ABSTRACT

In some aspects, the techniques described herein relate to an apparatus including: a semiconductor device substrate material; a first signal conductor incorporated into the semiconductor device substrate material; a second signal conductor incorporated into the semiconductor device substrate material; and a ground conductor incorporated into the semiconductor device substrate material between the first signal conductor and the second signal conductor, wherein the ground conductor includes a first elongated portion and a second elongated portion arranged at an angle relative to the first elongated portion.

20 Claims, 19 Drawing Sheets

VIA GROUND STRUCTURES

TECHNICAL FIELD

The present disclosure relates to printed circuit board grounding structures.

BACKGROUND

Serialized/Deserializer (Serdes) data rates are increasing rapidly, and signal integrity (SI) presents a design challenge for system performance. SI performance will be degraded over longer or degraded channels. SI engineering addresses system performance from the internal connections of an integrated circuit (IC), through the chip package, the printed circuit board (PCB), the backplane and the inter-system connections.

One key parameter to evaluate channel performance is Insertion Loss to Crosstalk Ratio (ICR). Crosstalk optimization is very important in system design. On the PCB, crosstalk comes from trace routing, the chip pinfield (and fan-out vias), the connector footprint, the via pattern, etc. Increasing the distance between aggressor and victim channels and including ground vias are techniques that may be used to decrease crosstalk in ball grid arrays (BGA), pinfield areas, and board-to-board connector pinfield areas. In other words, more ground vias are added or the space between PCB elements is increased to decrease crosstalk. However, it is difficult to have enough space in current high density designs to provide both sufficient crosstalk performance and a sufficient number of signaling conductors.

DETAILED DESCRIPTION

Overview

In some aspects, the techniques described herein relate to an apparatus including: a semiconductor device substrate material; a first signal conductor incorporated into the semiconductor device substrate material; a second signal conductor incorporated into the semiconductor device substrate material; and a ground conductor incorporated into the semiconductor device substrate material between the first signal conductor and the second signal conductor, wherein the ground conductor includes a first elongated portion and a second elongated portion arranged at an angle relative to the first elongated portion.

In some aspects, the techniques described herein relate to a method including: forming a first signal conductor in a semiconductor device substrate material; forming a second signal conductor in the semiconductor device substrate material; and forming, in the semiconductor device substrate material, a ground structure between the first signal conductor and the second signal conductor, wherein the ground structure includes a first elongated portion and a second elongated portion arranged at an angle relative to the first elongated portion.

In some aspects, the techniques described herein relate to an apparatus including: a semiconductor device substrate material, and a repeating pattern formed in the semiconductor device substrate material, wherein the repeating pattern includes at least one signal conductor and at least one ground conductor, wherein the at least one ground conductor includes a first elongated portion and a second elongated portion arranged at an angle relative to the first elongated portion.

Example Embodiments

As switch bandwidth increases, the number of serializer/deserializers (serdes) and their speeds are increasing in the chip. To provide 102.4 T switch bandwidth, 512 lanes of 224G serdes may be leveraged. With such high density (i.e., large number of serdes) and high speeds, signal integrity designs that achieve high performance for insertion loss, reflections and crosstalk are challenging. In order to provide a low level of crosstalk and a low level of reflections, spacing between ground and signal vias may need to be smaller than a quarter wavelength of the Nyquist frequency.

Ground vias are widely used in printed circuit board design and package design to decrease crosstalk. The conventional ground via shape is circular. Considering limited space, it becomes more difficult to add ground vias to, for example, ball grid arrays (BGAs) and connector areas. Even outside the BGA area, adding more ground vias impacts routing space, especially for current high density systems. Real-estate in routing areas is very precious. Therefore, adding additional circular ground vias to a routing area may negatively affect routing area design.

Figure 1A:
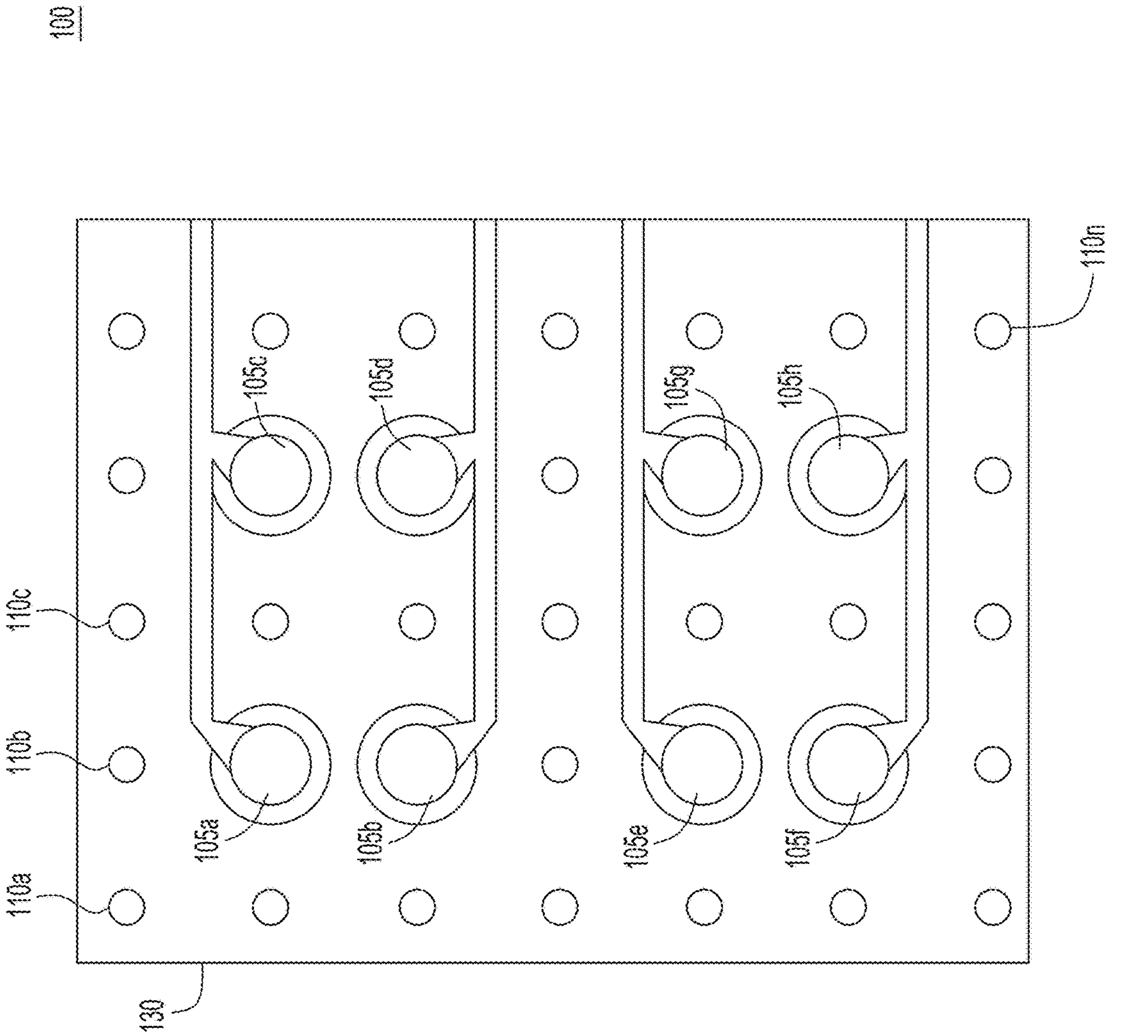
FIG. 1A is an overhead view of a ball map pattern that includes circular ground vias and circular signal vias.
Figure 1B:
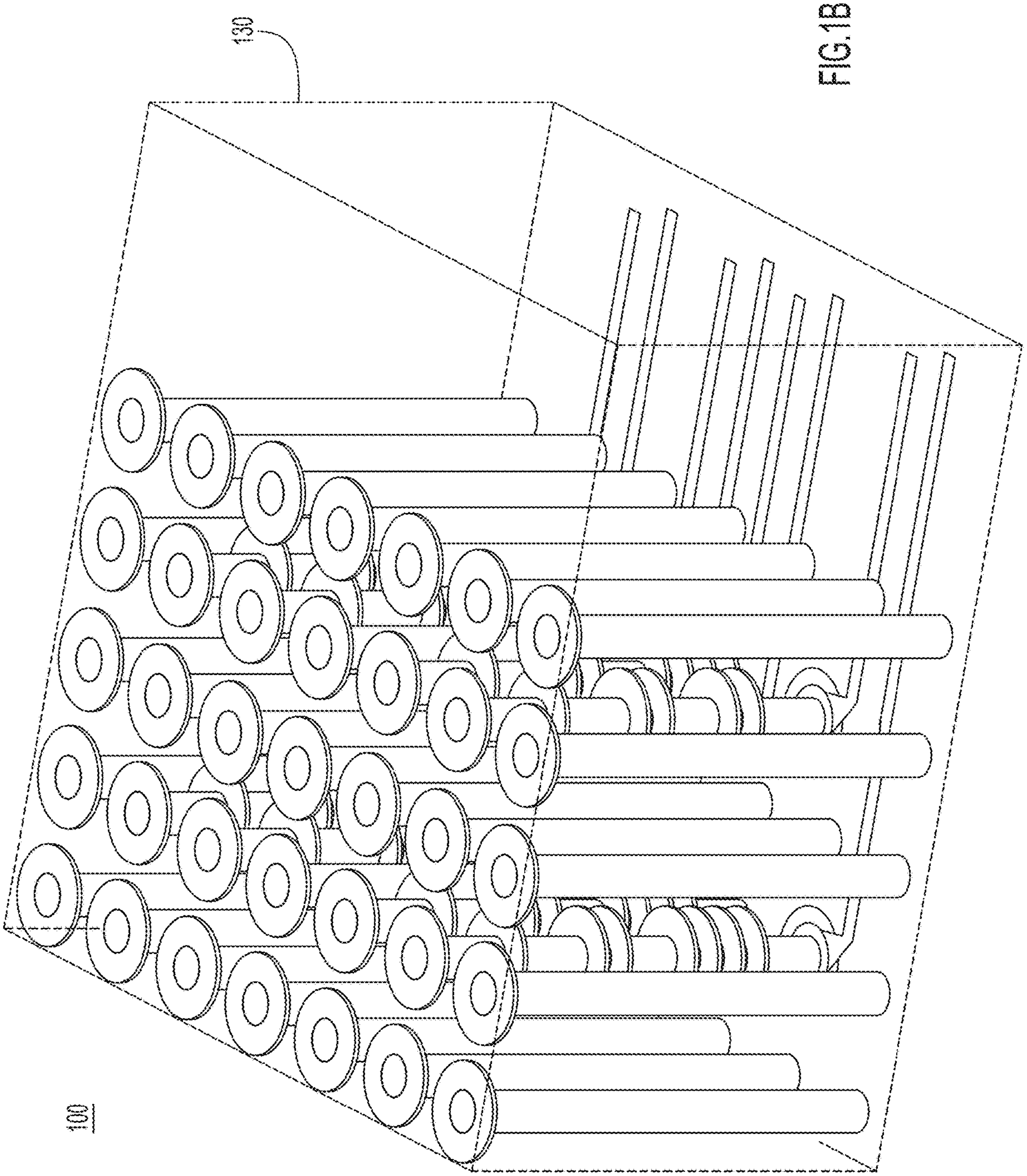
FIG. 1B is a perspective view of the ball map pattern of FIG. 1A, illustrating how the circular ground and signal vias extend into a printed circuit board (PCB) or a semiconductor device substrate material.
Figure 1C:
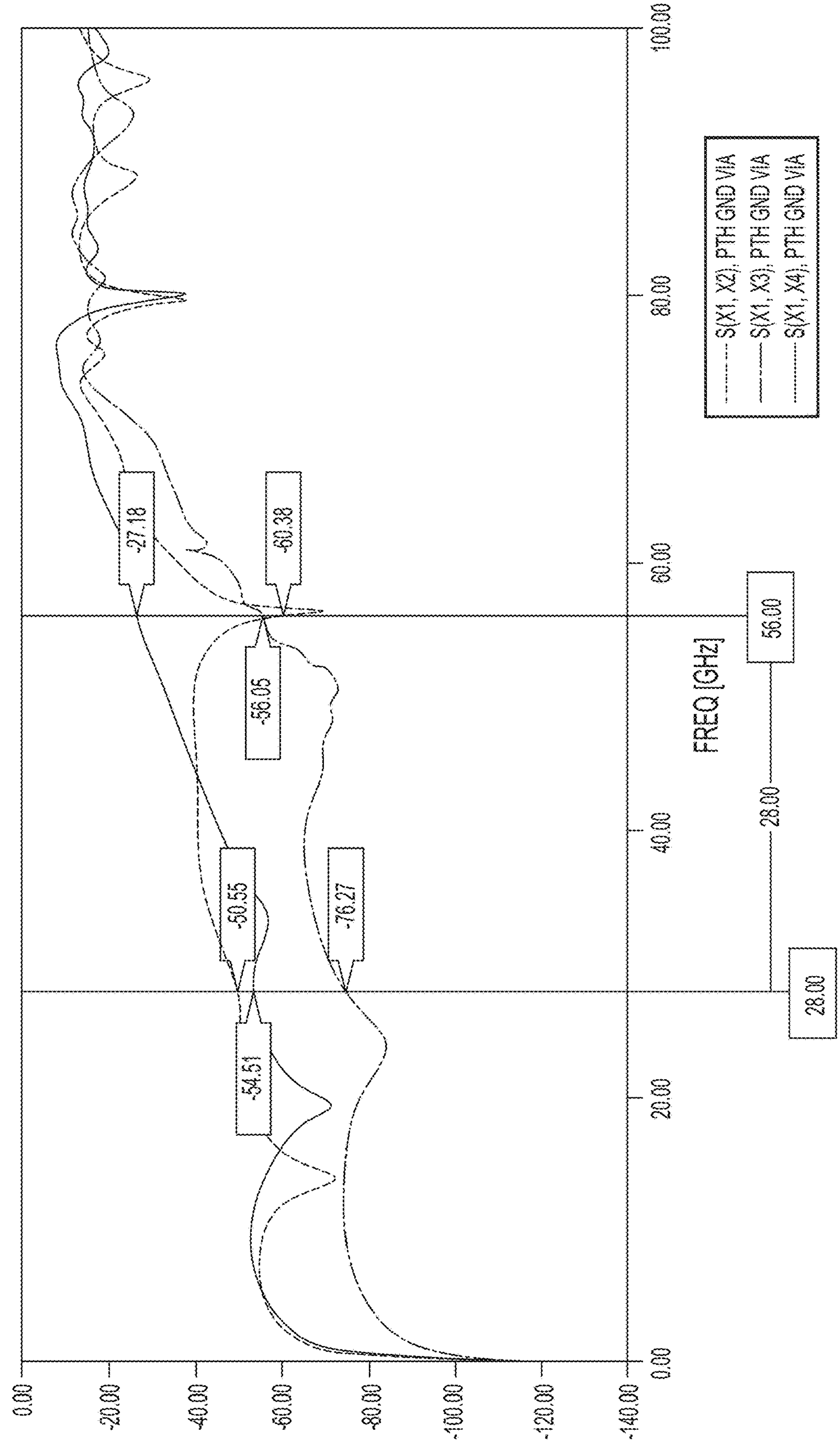
FIG. 1C is a graph of near end crosstalk performance associated with a pair of signal vias in the ball map pattern of FIG. 1A.
Figure 1D:
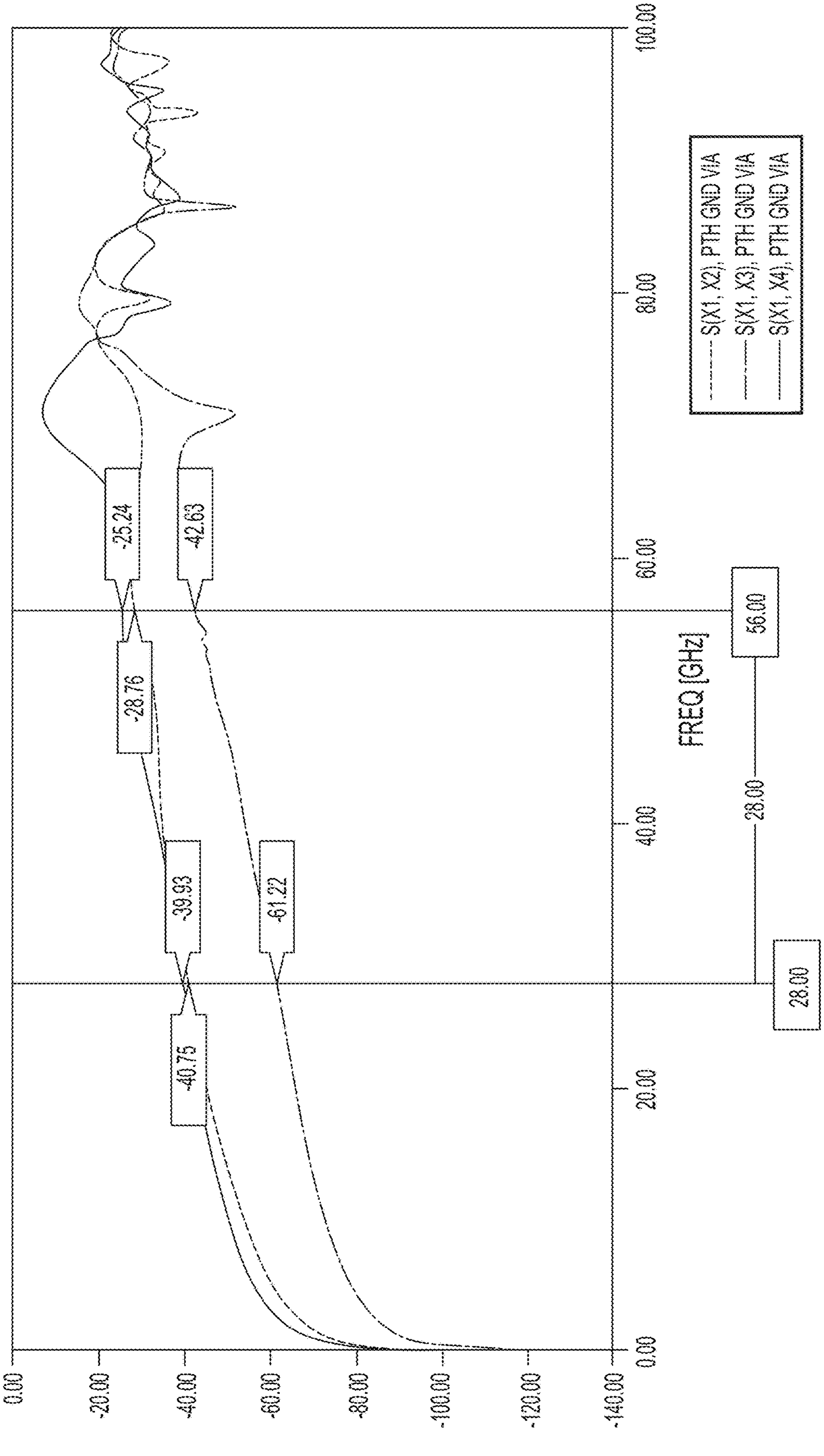
FIG. 1D is a graph of far end crosstalk performance associated with a pair of signal vias in the ball map pattern of FIG. 1A.

As data rates increase, crosstalk requirements are also becoming more stringent. In a 50G Pulse Amplitude Modulation 4-Level (PAM4) system it may be acceptable for near end crosstalk (NEXT) to be around −50 dB and far end crosstalk (FEXT) to be around −40 dB. But for 112G (and beyond) or 224G systems, this level of crosstalk is not acceptable. For example, illustrated in FIGS. 1A and 1B are a ball map pattern 100 that includes signal vias 105*a*, 105*b*, 105*c*, 105*d*, 105*c*, 105*f*, 105*g*, and 105*h* (105*a*-*h*) and ground vias 110*a*, 110*b*, 110*c*, . . . 110*n* (110*a*-*n*). FIG. 1A illustrates the ball map pattern 100 from an overhead view while FIG. 1B illustrates ball map pattern 100 from a perspective view showing how the vias extend into a substrate material 130, such as a printed circuit board. Though not illustrated, ground vias 110*a*-*n* may be electrically connected to ground planes or other grounding structures within substrate material 130. As illustrated in FIGS. 1C and 1D, such an arrangement of circular signal vias 105*a*-*h* and circular ground vias 110*a*-*n* provides marginally acceptable levels of NEXT (FIG. 1C) and FEXT (FIG. 1D) for a 56G PAM4 application. However, as also illustrated in FIGS. 1C and 1D, respectively, 224G application NEXT and FEXT requirements are not met by such an arrangement.

Specifically, FIG. 1C illustrates the NEXT performance as a function of frequency for the differential signal pair of signal vias 105*e* and 105*f* caused by the other signaling pairs in ball map pattern 100. Similarly, FIG. 1D illustrates the FEXT performance as a function of frequency for the differential signal pair of signal vias 105*e* and 105*f* caused by the other signaling pairs in ball map pattern 100. As illustrated in FIGS. 1C and 1D, the crosstalk performance at the frequencies associated with a 56G PAM4 application is marginally acceptable. However, at the frequencies associated with a 224G application, the crosstalk performance falls below the required specification.

Figure 2:
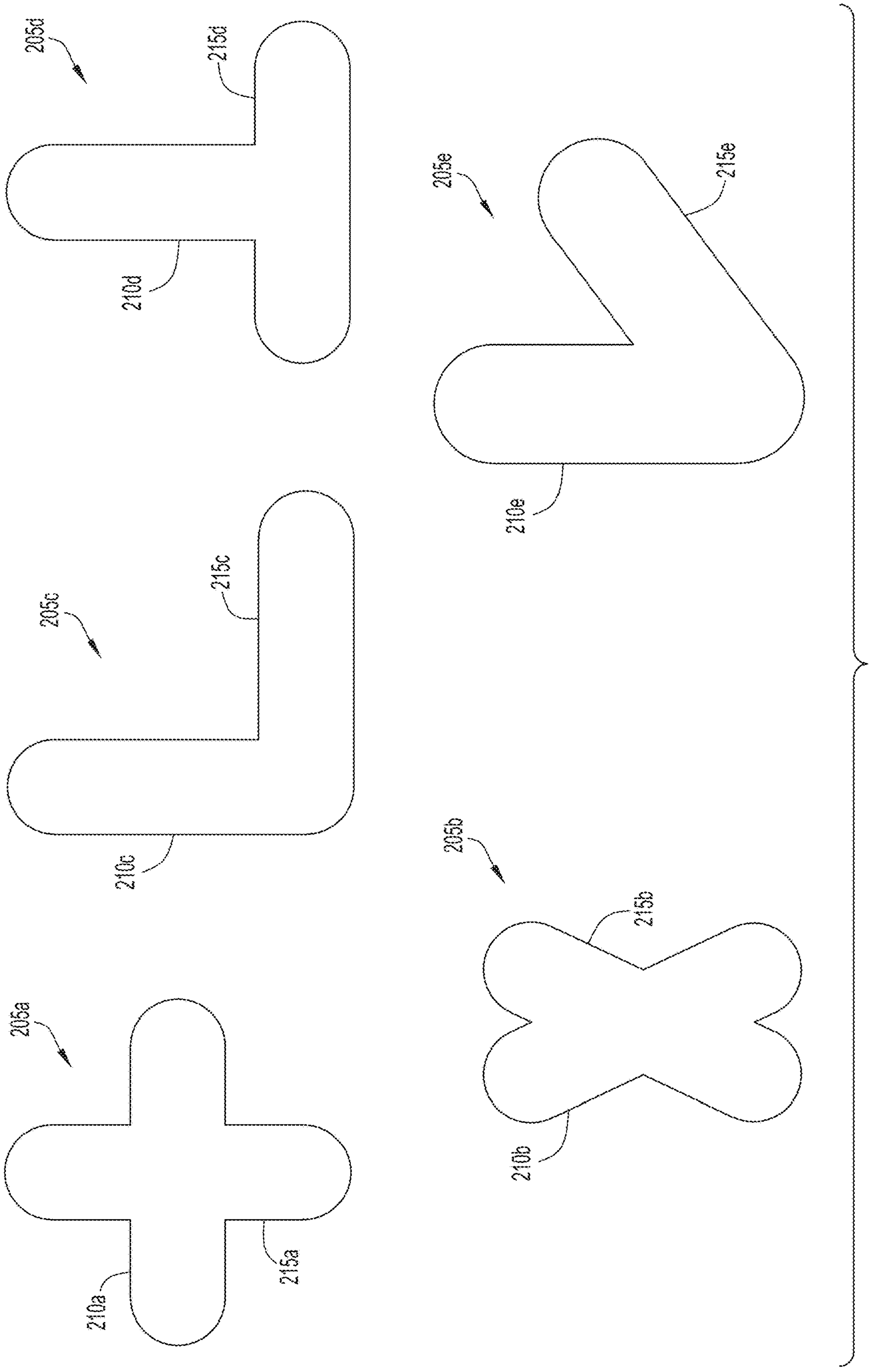
FIG. 2 illustrates a plurality of different shaped ground x-vias, according to example embodiments.

Accordingly, in order to improve crosstalk in a particular area, the techniques disclosed herein provide a new ground via structure that has a "+" or "X" shape instead of the traditional circle via shape. Other via shapes according to the disclosed techniques may include "V," "L" or "T" shapes, among others. The via structure of the disclosed techniques is characterized in that it has a first elongated portion that is arranged at an angle relative to a second elongated portion. Accordingly, illustrated in FIG. 2 are a number of ground x-vias 205*a*, 205*b*, 205*c*, 205*d* and 205*c* according to the disclosed techniques. For simplicity of description, each of these types of vias is referred to herein as an "x-via." However, as illustrated in FIG. 2, not all of x-vias 205*a*, 205*b*, 205*c*, 205*d* and 205*e* have an "X" shape. Instead, each of x-vias 205*a*, 205*b*, 205*c*, 205*d* and 205*c* includes a first elongated portion arranged at an angle relative to a second elongated portion.

For example, x-via 205*a* has a "+" shaped formed by first elongated portion 210*a* intersecting second elongated portion 215*a* at a right angle. X-via 205*b* differs from x-via 205*a* in that first elongated portion 210*b* intersects second elongated portion 215*b* at an angle other than 90°, thereby providing x-via 205*b* with an "X" shape. X-via 205*c* has an "L" shape because first elongated portion 210*c* is arranged at a right angle relative to second elongated portion 215*c*, but where first elongated portion 210*a* and second elongated portion 215*a* of x-via 205*a* intersect at their respective midpoints, the end of first elongated portion 210*c* abuts an end of second elongated portion 215*c*. X-via 205*d* is provided with a "T" shape because an end of first elongated portion 210*d* intersects the midpoint of second elongated portion 215*d*. Finally, x-via 205*e* is provided with a "V" shape because an end of first elongated portion 210*e* abuts an end of second elongated portion 215*e* at an angle other than 90°.

As explained in detail below, using ground vias shaped like one or more of x-vias 205*a*-*e* in combination with circular signal vias results in dramatically improved crosstalk when compared with ball map patterns with circular ground vias. Specifically, the ground vias are provided with the shapes of x-vias 205*a*-*e* to provide additional isolation in the multiple directions defined by the intersection of the elongated portions of x-vias 205*a*-*c*.

Figure 3A:
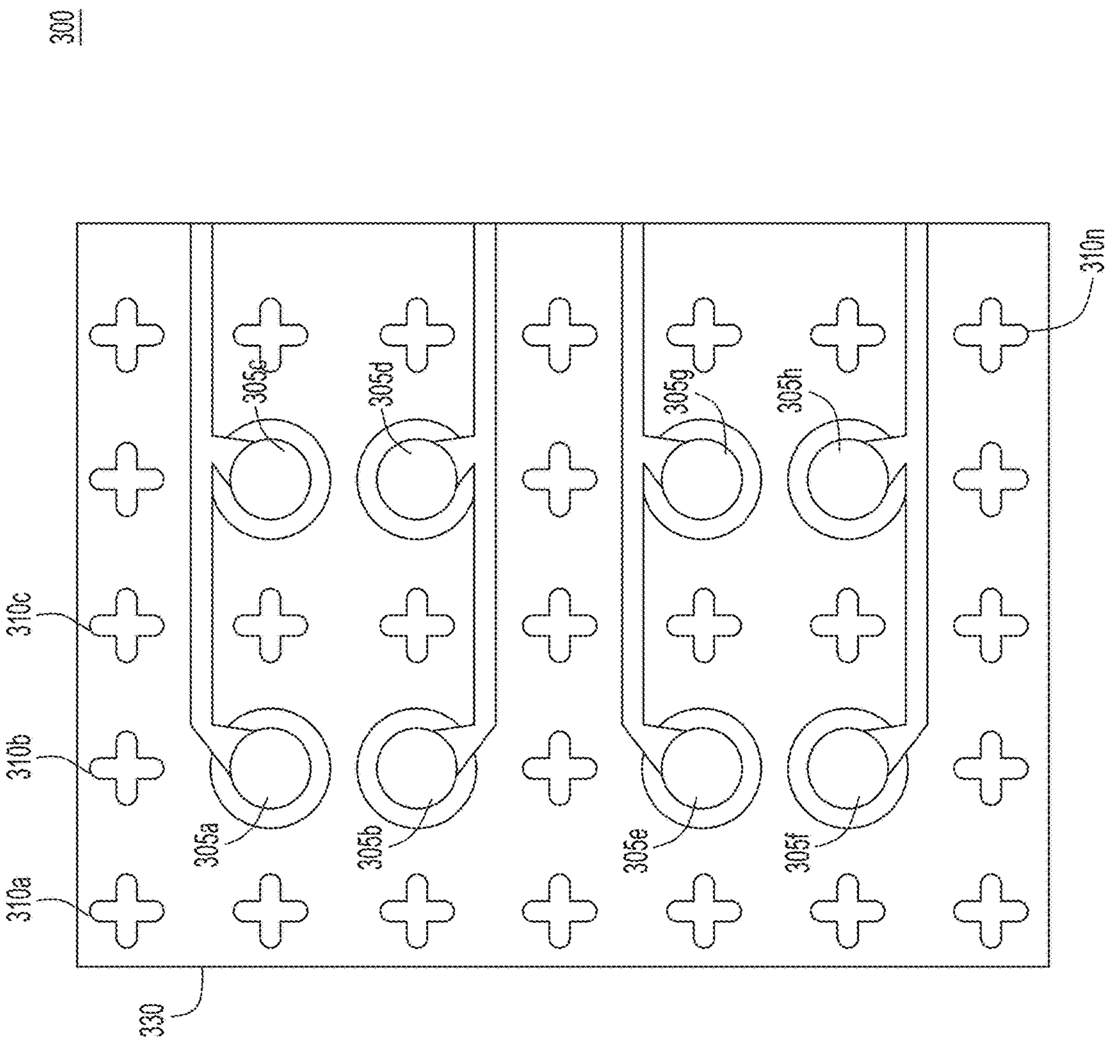
FIG. 3A is an overhead view of a ball map pattern that includes ground x-vias and circular signal vias, according to an example embodiment.
Figure 3B:
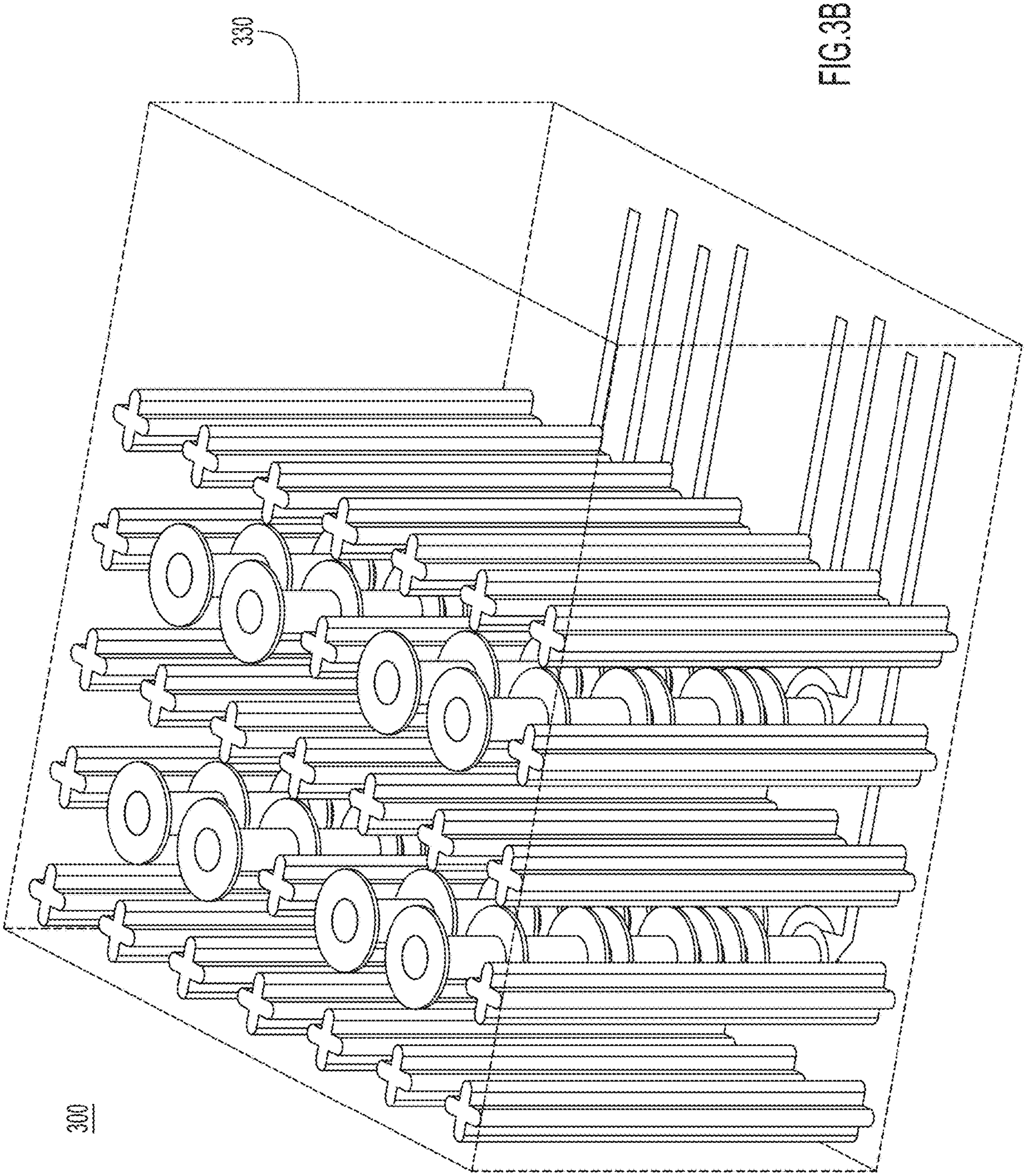
FIG. 3B is a perspective view of the ball map pattern of FIG. 3A, illustrating how the ground x-vias and circular signal vias extend into a PCB or a semiconductor device substrate material.

Illustrated in FIGS. 3A and 3B is a ball map pattern 300 in which the circular ground vias 110*a*-*n* of FIGS. 1A and 1B have been replaced with ground x-vias 310*a*, 310*b*, 310*c*, . . . 310*n* (310*a*-*n*), while signal vias 305*a*, 305*b*, 305*c*, 305*d*, 305*e*, 305*f*, 305*g*, and 305*h* (305*a*-*h*) remain circular, like signal vias 105*a*-*h* of FIGS. 1A and 1B. FIG. 3A illustrates ball map pattern 300 in an overhead view, while FIG. 3B illustrates ball map pattern 300 in a perspective view, showing how circular signal vias 305*a*-*h* and ground x-vias 310*a*-*n* extend into a substrate material 330, such as a printed circuit board. Though not illustrated, ground x-vias 310*a*-*n* may be electrically connected to ground planes or other grounding structures within substrate material 330.

Figure 3C:
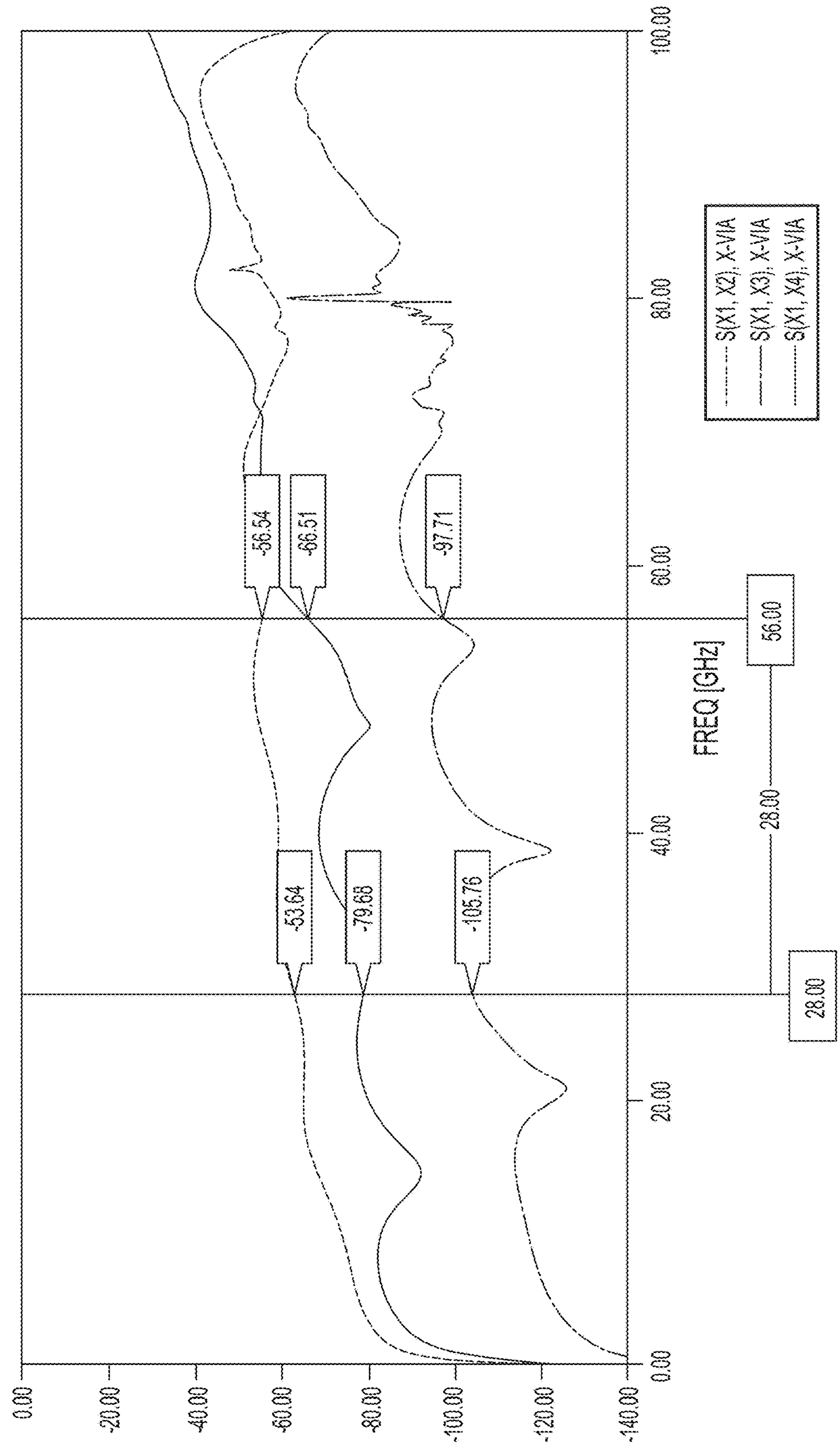
FIG. 3C is a graph of near end crosstalk performance associated with a pair of signal vias in the ball map pattern of FIG. 3A, according to an example embodiment.
Figure 3D:
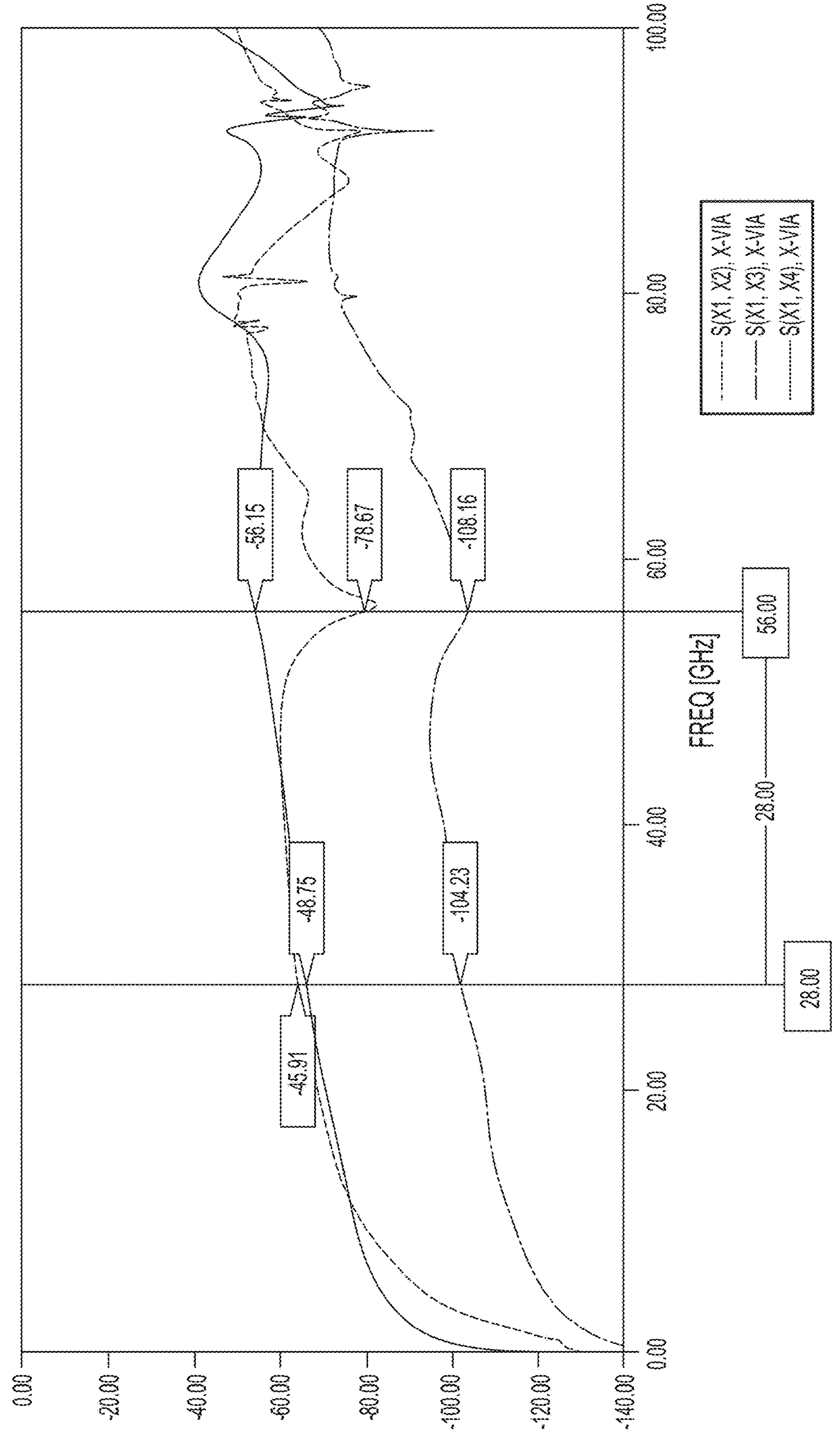
FIG. 3D is a graph of far end crosstalk performance associated with a pair of signal vias in the ball map pattern of FIG. 3A, according to an example embodiment.

The ball map pattern 300 of FIGS. 3A and 3B has been simulated, and the simulated NEXT and FEXT results are illustrated in FIGS. 3C and 3D, respectively, for a number of frequency ranges. Specifically, FIG. 3C illustrates the NEXT performance as a function of frequency for the differential signal pair of signal vias 305*e* and 305*f* caused by the other signaling pairs in ball map pattern 300. Similarly, FIG. 3D illustrates the FEXT performance as a function of frequency for the differential signal pair of signal vias 305*e* and 305*f* caused by the other signaling pairs in ball map pattern 300. As illustrated in FIGS. 3C and 3D, the crosstalk performance at the frequencies associated with both 56G PAM4 applications and 224G applications is acceptable.

Accordingly, as illustrated in FIGS. 3C and 3D, the use of the x-via techniques disclosed herein dramatically improves crosstalk performance, both NEXT (FIG. 3A) and FEXT (FIG. 3B), particularly when compared with the performance of ball map pattern 100 of FIGS. 1A and 1B. A comparison of FIGS. 3C and 3D with FIGS. 1C and 1D shows that there is an average of 20 dB plus improvement in crosstalk performance using the ground x-via-based ball map pattern 300. Furthermore, ball map pattern 300 presents no signal integrity issue for 224G applications, even when a greater number of crosstalk aggressors PCB elements are included.

Figure 4B:
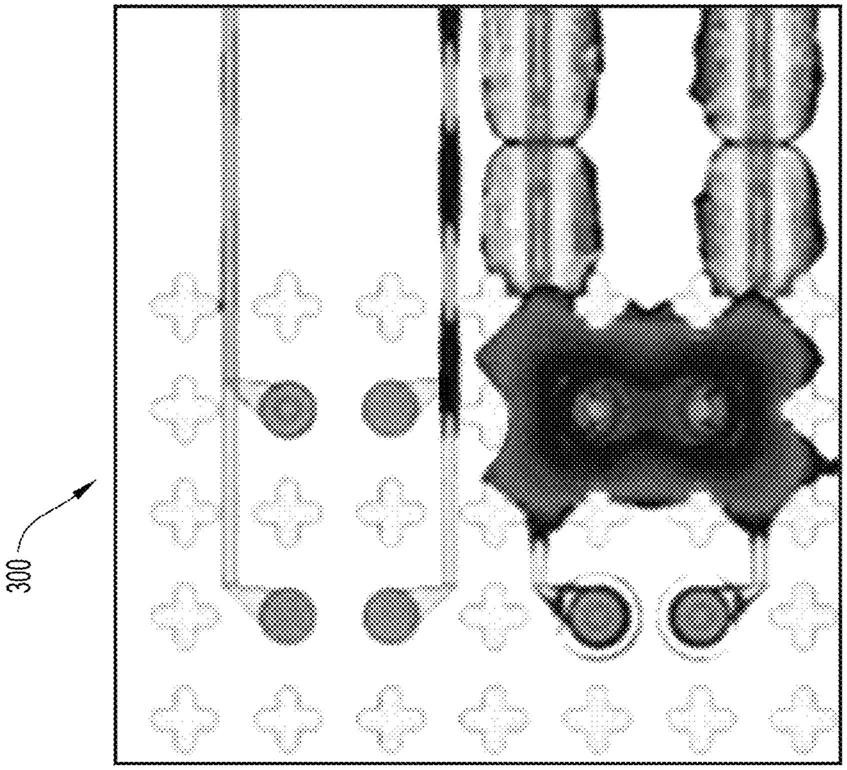
FIG. 4B illustrates the electric fields formed by the operation of a signal pair in the ball map pattern of FIG. 3A, according to an example embodiment.
Figure 4A:
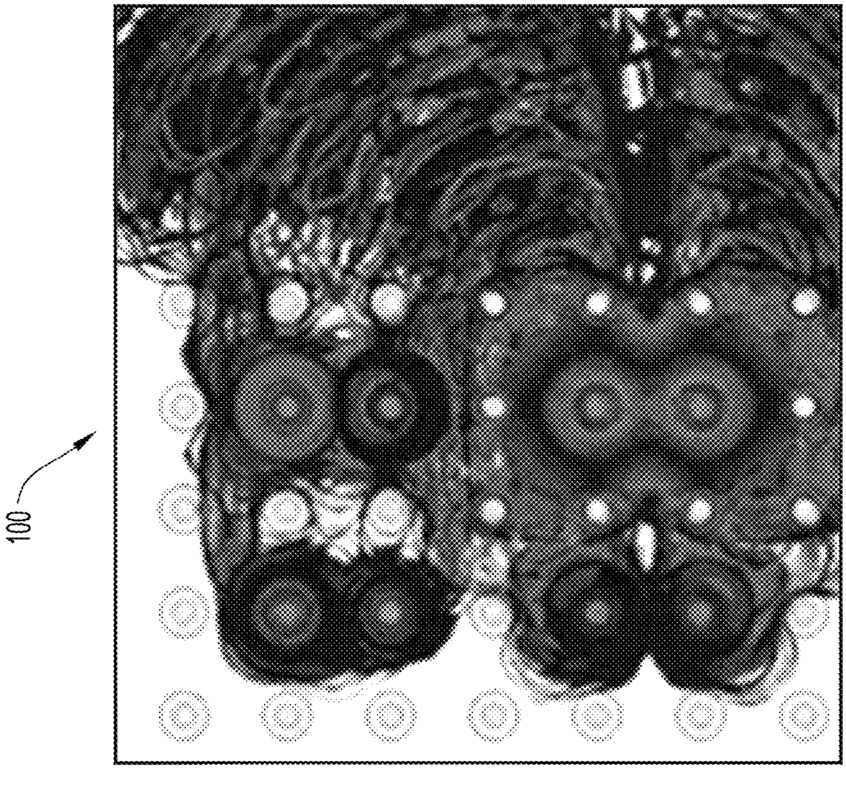
FIG. 4A illustrates the electric fields formed by the operation of a signal pair in the ball map pattern of FIG. 1A.

It has been found that ground x-via structures benefit crosstalk performance dramatically because more isolation is provided by the ground x-via in both directions (i.e., the directions defined by the elongated portions of the ground x-via) when compared with circular ground vias. For example, illustrated in FIGS. 4A and 4B is a comparison of the isolation provided by circular ground vias (FIG. 4A) and the ground x-vias (FIG. 4B). Illustrated in FIG. 4A are the electric fields extending outward from the differential signal pair of signal vias 105*g* and 105*h* of ball map pattern 100 of FIG. 1A during signal transmission. FIG. 4B, on the other hand, illustrates the electric fields extending outward from the differential signal pair of signal vias 305*g* and 305*h* of ball map pattern 300 of FIG. 3A. As illustrated in FIG. 4B, the electric fields associated with differential pair signal vias 305*g* and 305*h* are contained by the ground x-vias to a much greater extent than the containment of the electric fields associated with differential pair signal vias 105*g* and 105*h* by the circular ground vias of ball map pattern 100. Specifically, the electric fields illustrated in FIG. 4A extend much further than those illustrated in FIG. 4B, with the fields extending from the source differential signal pair to the other differential signal pairs of the ball map pattern. The electrical fields in FIG. 4B, on the other hand, are contained by the x-vias such that the electric fields are more localized around the source differential signal pair. The greater electric field containment provided by the ground x-vias in FIG. 4B results in improved return loss and crosstalk performance in ball map pattern 300.

The use of the disclosed ground x-vias also provides a cost effective solution for 224G and 112G applications, and beyond. The ground x-vias may allow for normal printed circuit board manufacturing processes to be used to address challenging signal integrity problems. For example, some high density designs require the use of high-density interconnect (HDI) sequential lamination manufacturing techniques, which can increase costs and manufacturing complexity. The ground x-via structure techniques disclosed herein, on the other hand, can be manufactured by normal drill processes. The x-via drill processes may introduce some additional manufacturing time compared to standard circular manufacturing, e.g., using two drill processes per ground via instead of one. However, the manufacturing process may not be otherwise more complicated or involved. Accordingly, the cost added in implementing the ground x-vias is limited.

Furthermore, there is no limit to where the ground x-via structures may be used on the printed circuit board—the use of x-vias is not limited to the BGA area. Illustrated in FIGS. 5A-B. 6A-B. 7A-B and 8A-B are comparisons of conventional circular ground vias with ground x-via structures in BGA pinfield, board-to-board connector, backplane connector, and high speed digital change layer applications, respectively.

Figure 5A:
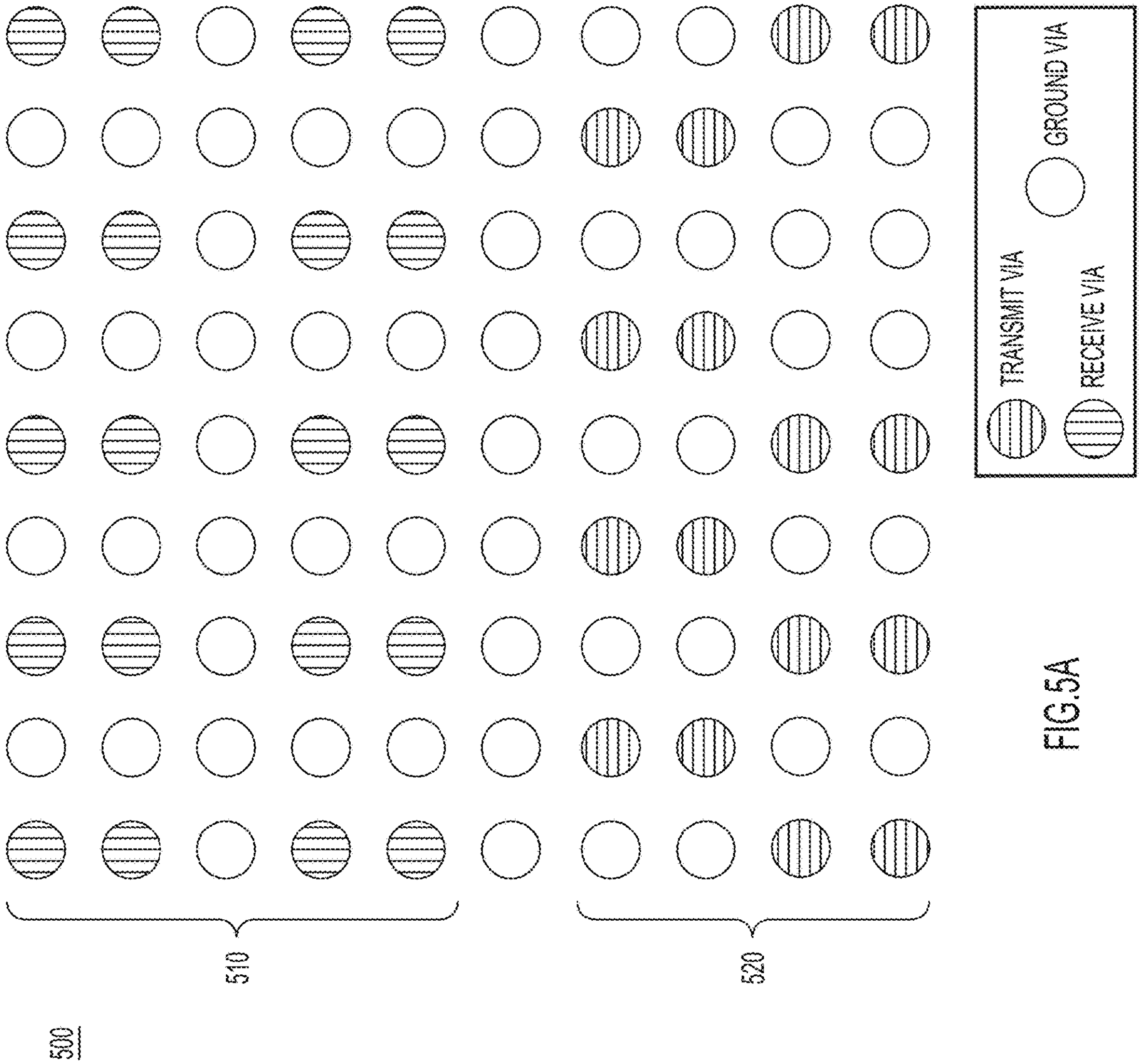
FIG. 5A is a ball grid array that includes circular ground vias.
Figure 5B:
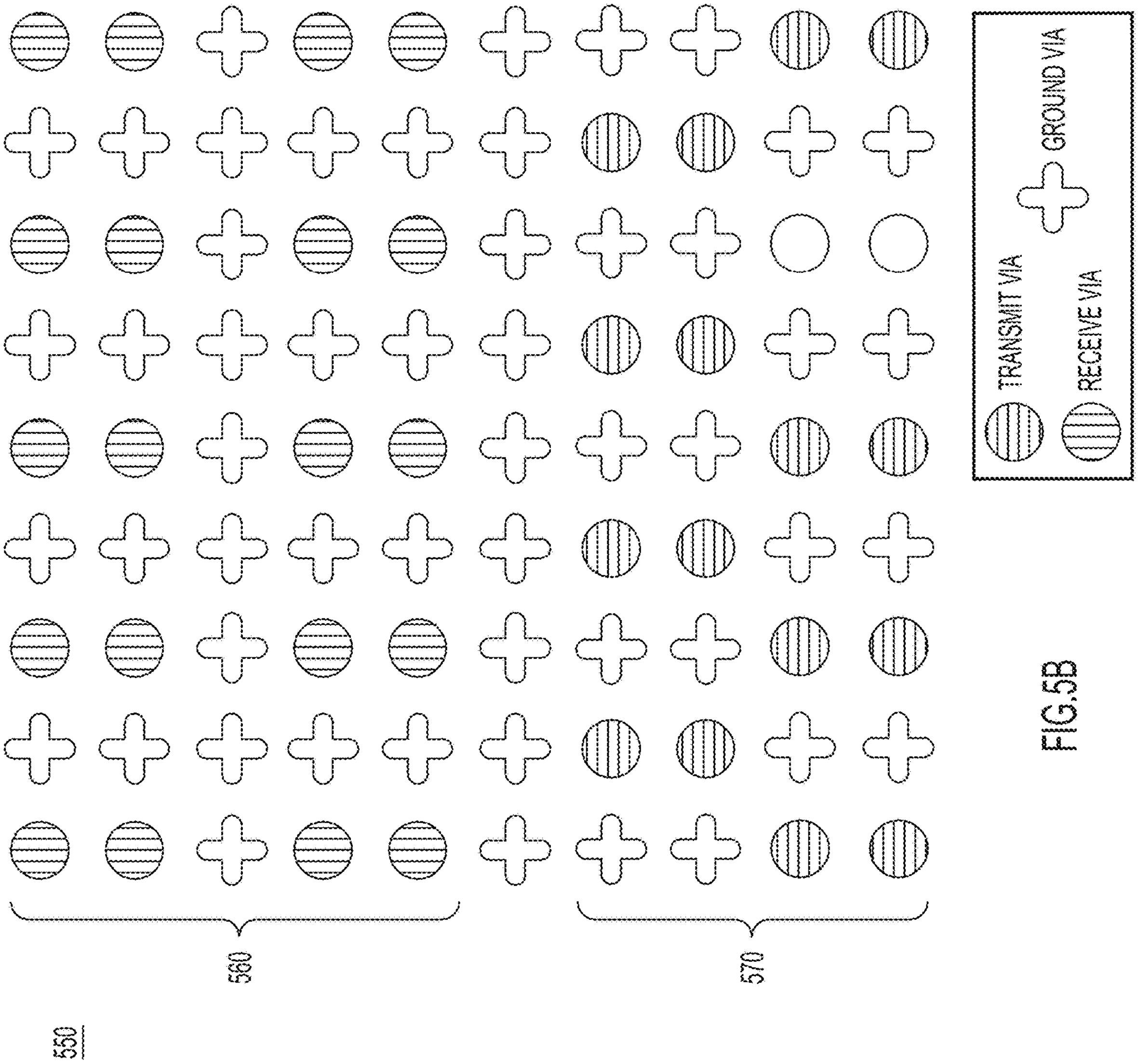
FIG. 5B is a ball grid array that includes ground x-vias, according to an example embodiment.

Beginning with FIGS. 5A and 5B, illustrated in FIG. 5A is BGA pinfield 500 constructed using conventional circular ground vias. Pinfield 500 includes a receive portion 510, in which the signal vias arranged therein form differential pairs of receive signal vias. Transmit portion 520, on the other hand, includes differential pairs of transmit signal vias. BGA pinfield 550 of FIG. 5B replaces the circular ground vias of pinfield 500 with ground x-vias in both receive portion 560 and transmit portion 570. Accordingly, pinfield 550 will exhibit increased signal integrity, crosstalk, insertion loss and reflection performance when compared with pinfield 500.

Figure 6A:
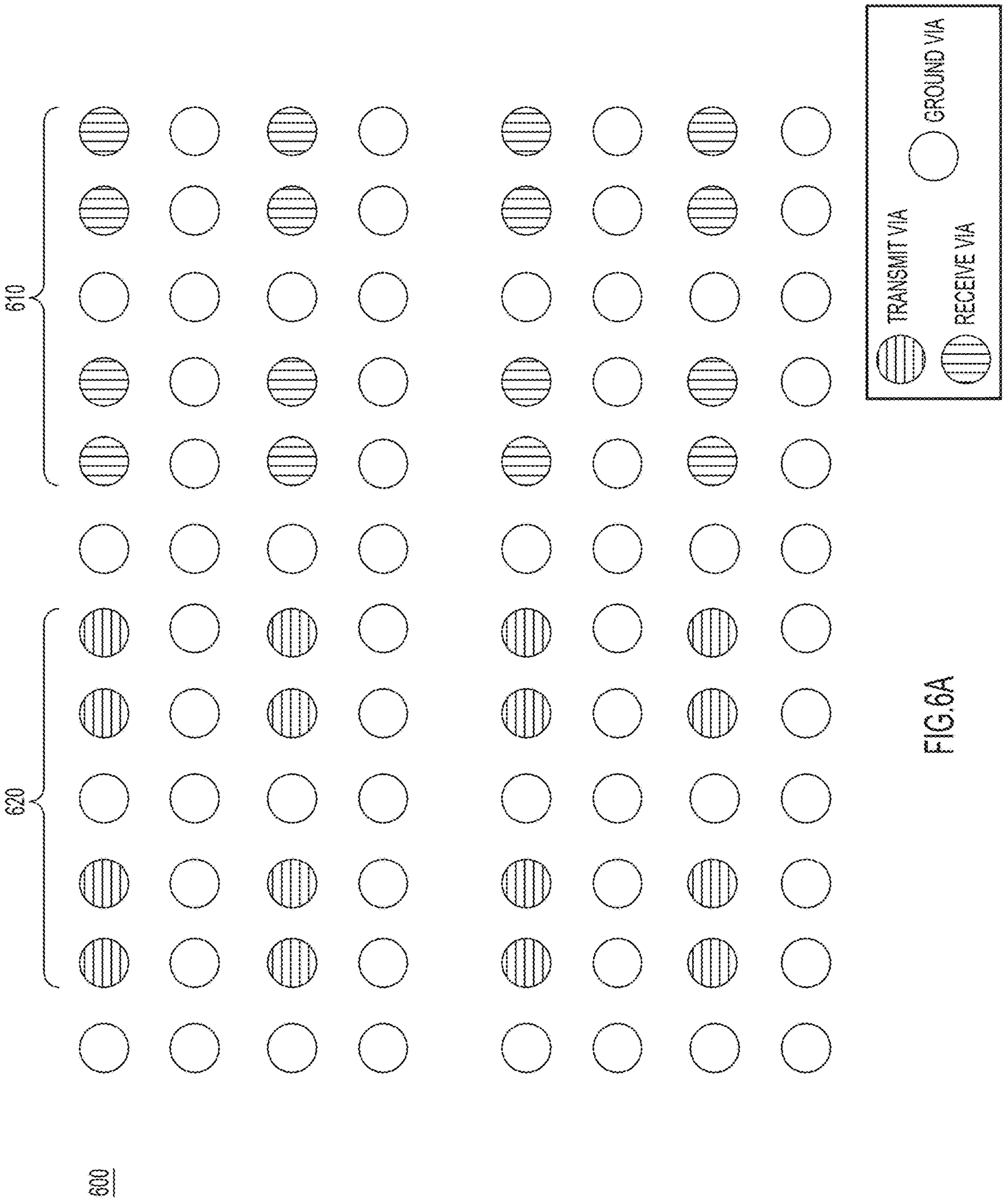
FIG. 6A is a board-to-board connector area that includes circular ground vias.

Illustrated in FIG. 6A is board-to-board connector area 600 constructed using conventional circular ground vias. Board-to-board connector area 600 includes a receive portion 610 which includes differential pairs of receive signal vias and transmit portion 620 which includes differential pairs of transmit signal vias. Board-to-board connector area 650 of FIG. 6B replaces the circular ground vias of board-to-board connector area 600 with ground x-vias in both receive portion 660 and transmit portion 670. Accordingly, board-to-board connector area 650 will exhibit increased signal integrity, crosstalk, insertion loss and reflection performance when compared with board-to-board connector area 600.

Figure 7A:
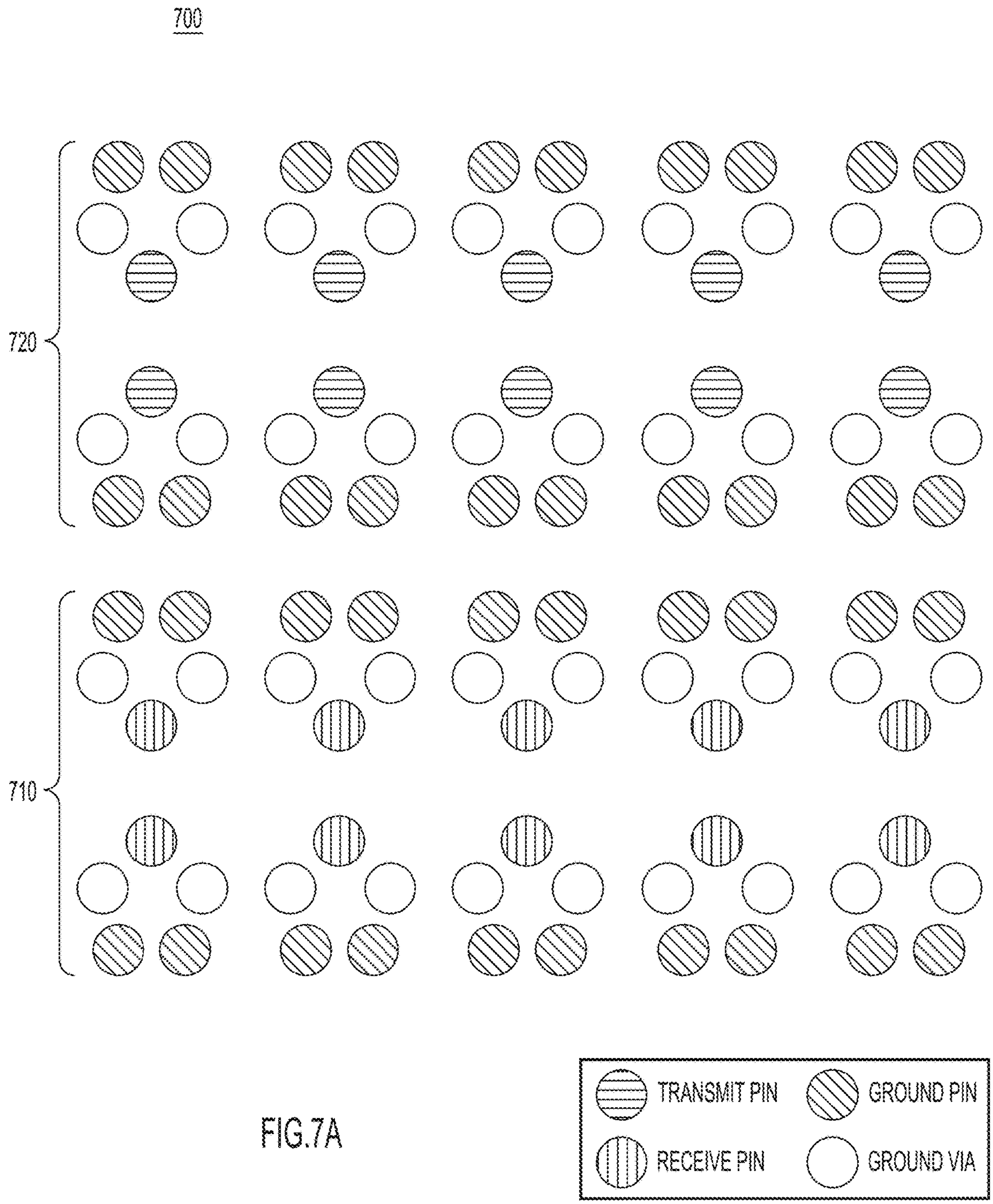
FIG. 7A is a backplane connector area that includes circular ground vias.
Figure 7B:
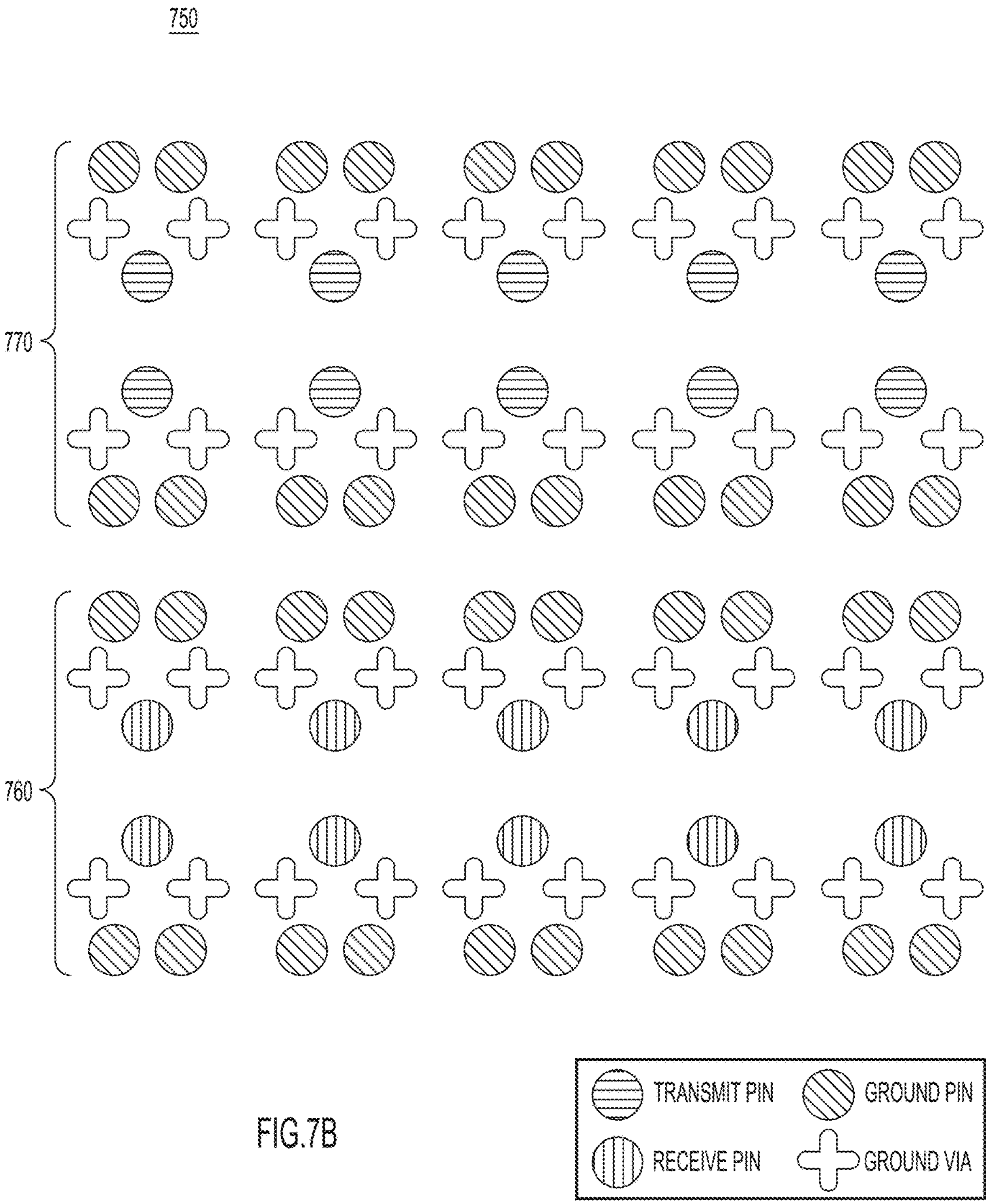
FIG. 7B is a backplane connector area that includes ground x-vias, according to an example embodiment.

With reference now made to FIGS. 7A and 7B, illustrated in FIG. 7A is a backplane connector area 700 that includes a receive portion 710 which includes differential pairs of receive pins and transmit portion 720 which includes differential pairs of transmit pins. Backplane connector area 700 also includes ground pins to provide grounding connections and ground vias to provide isolation. Backplane connector area 750 of FIG. 7B also includes a receive portion 760 with differential pairs of receive pins and transmit portion 770 with differential pairs of transmit pins. Backplane connector area 750 also includes circular ground pins. However, the ground vias of backplane connector area 750 have been implemented using ground x-vias according to the techniques disclosed herein, resulting in backplane connector area 750 exhibiting improved signal integrity, crosstalk, insertion loss and reflection performance when compared with backplane connector area 700. As illustrated in FIG. 7B, the ground vias have been implemented through ground x-vias; however, the ground pins have been provided using a conventional circular shape. This is done because the ground pins receive connectors, such as solder balls. Therefore, the ground pins are provided using the conventional circular shape. The ground vias, on the other hand, are implemented using the x-via techniques disclosed herein to provide improved isolation.

Figure 8A:
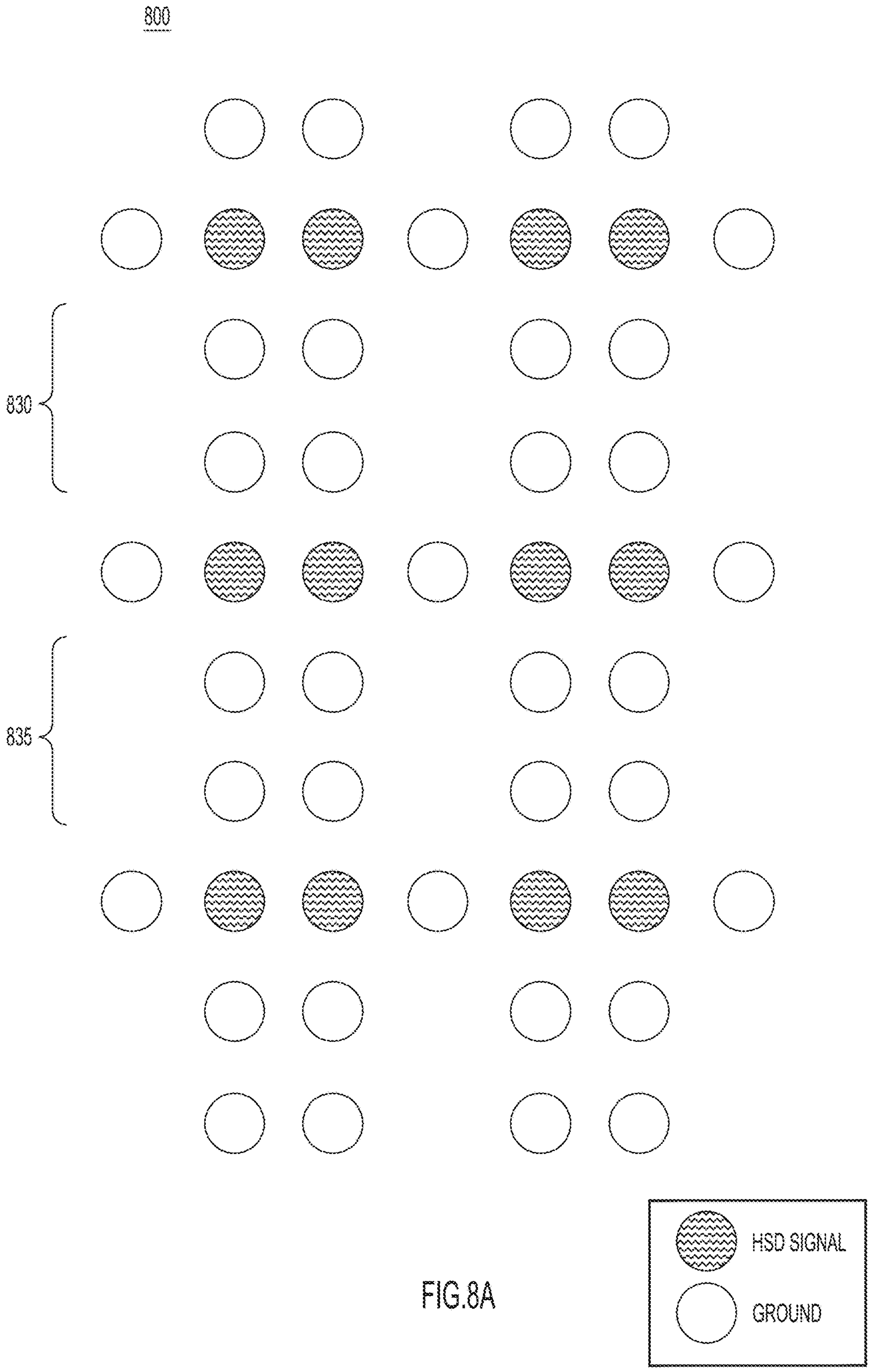
FIG. 8A is a high speed digital change layer with transition vias that also includes circular ground vias for isolation.
Figure 8B:
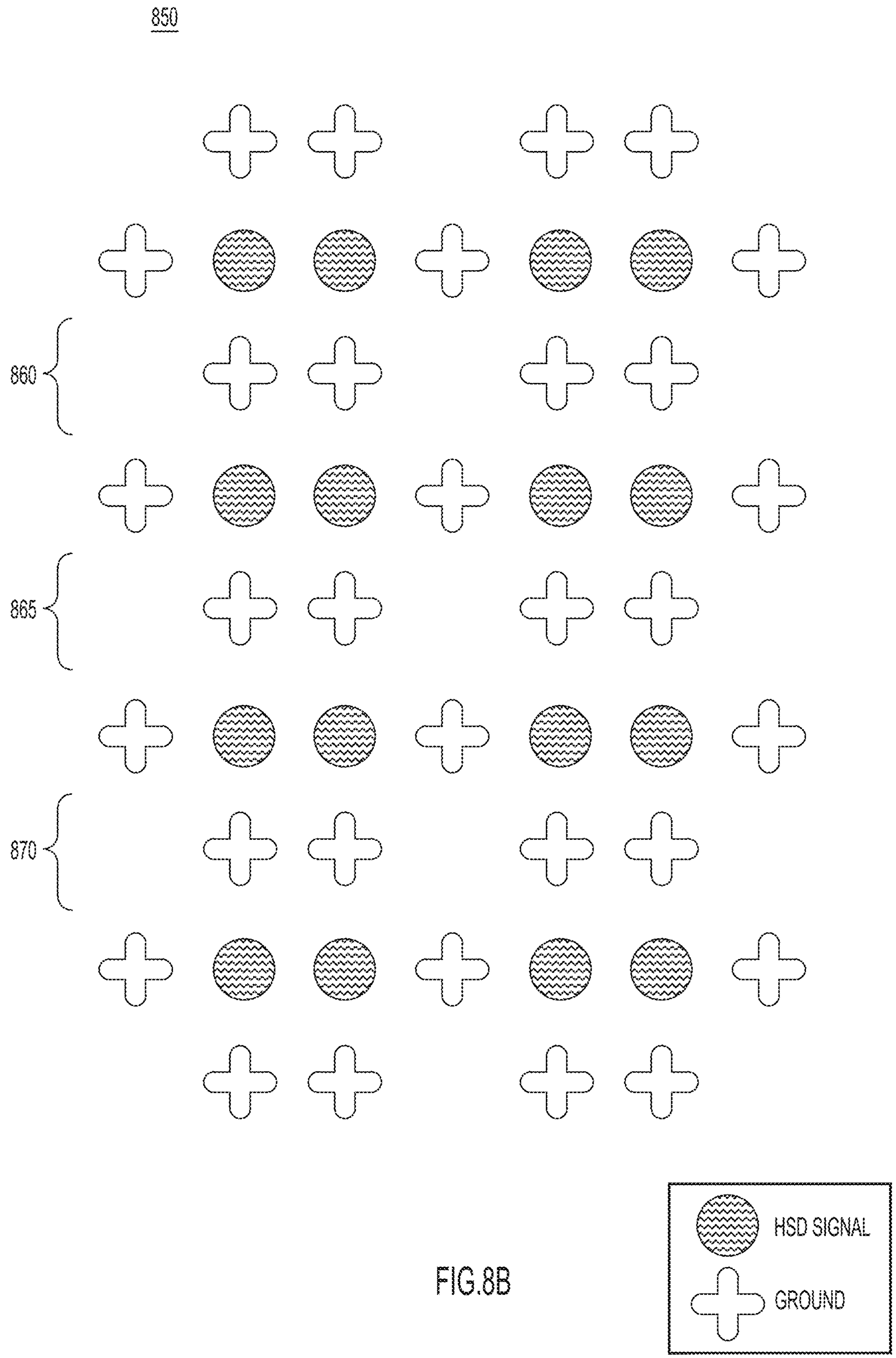
FIG. 8B is a high speed digital change layer with transition vias that also includes ground x-vias for isolation, according to an example embodiment.
Figure 9:
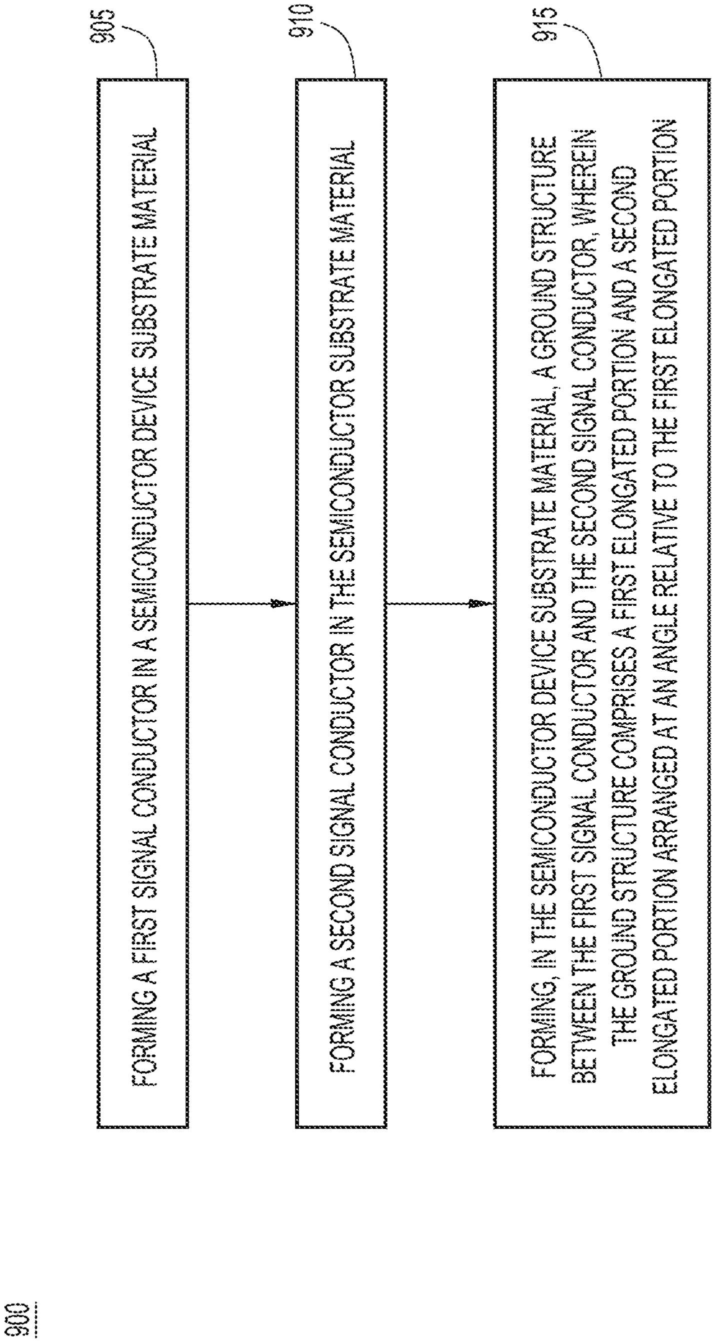
FIG. 9 is a flowchart illustrating a process flow for implementing the ground x-via techniques of the present disclosure, according to an example embodiment.

Turning to FIGS. 8A and 8B, illustrated in FIG. 8A is a high speed digital change layer 800 that includes differential pairs of high speed digital signal vias and conventional circular ground vias. As illustrated in FIG. 8A, the grounding portions 830 and 835 arranged between the signal differential pairs in the vertical direction of FIG. 8A include two rows of ground vias. However, due to the improved isolation provided by ground x-via structures, grounding portions 860, 865 and 870 of high speed digital change layer 850 of FIG. 8B include a single layer of ground x-vias. Accordingly, by leveraging the improved isolation provided ground x-vias, high speed digital change layer 850 of FIG. 8B may be implemented with a higher density of signal vias than high speed digital change layer 800 of FIG. 8A, With reference now made to FIG. 9, depicted therein is a flowchart 900 providing a process flow for implementing the techniques of the present disclosure. Flowchart 900 begins in operation 905 in which a first signal conductor is formed in a semiconductor device substrate material. Flowchart 900 continues in operation 910 in which a second signal conductor is formed in the semiconductor device substrate material. As discussed above, both of operations 905 and 910 may be embodied as the formation of a first circular signal via and a second circular signal via. Accordingly, operations 905 and 910 may include the drilling of first and second holes in a printed circuit board and then plating the first and second holes with a conductor, such as copper.

Flowchart 900 continues in operation 915 in which a ground conductor is formed in the semiconductor device substrate material. The ground structure is formed between the first signal conductor and the second signal conductor. Additionally, the ground structure is formed such that it includes a first elongated portion and a second elongated portion arranged at an angle relative to the first elongated portion. Accordingly, operation 915 may be embodied as the formation of a ground x-via as described above with reference to FIGS. 2, 3A-D, 4B, 5B, 6B, 7B and 8B. As also discussed above, ground x-vias may be formed using standard PCB manufacturing techniques, including conventional drilling and plating processes.

Figure 6B:
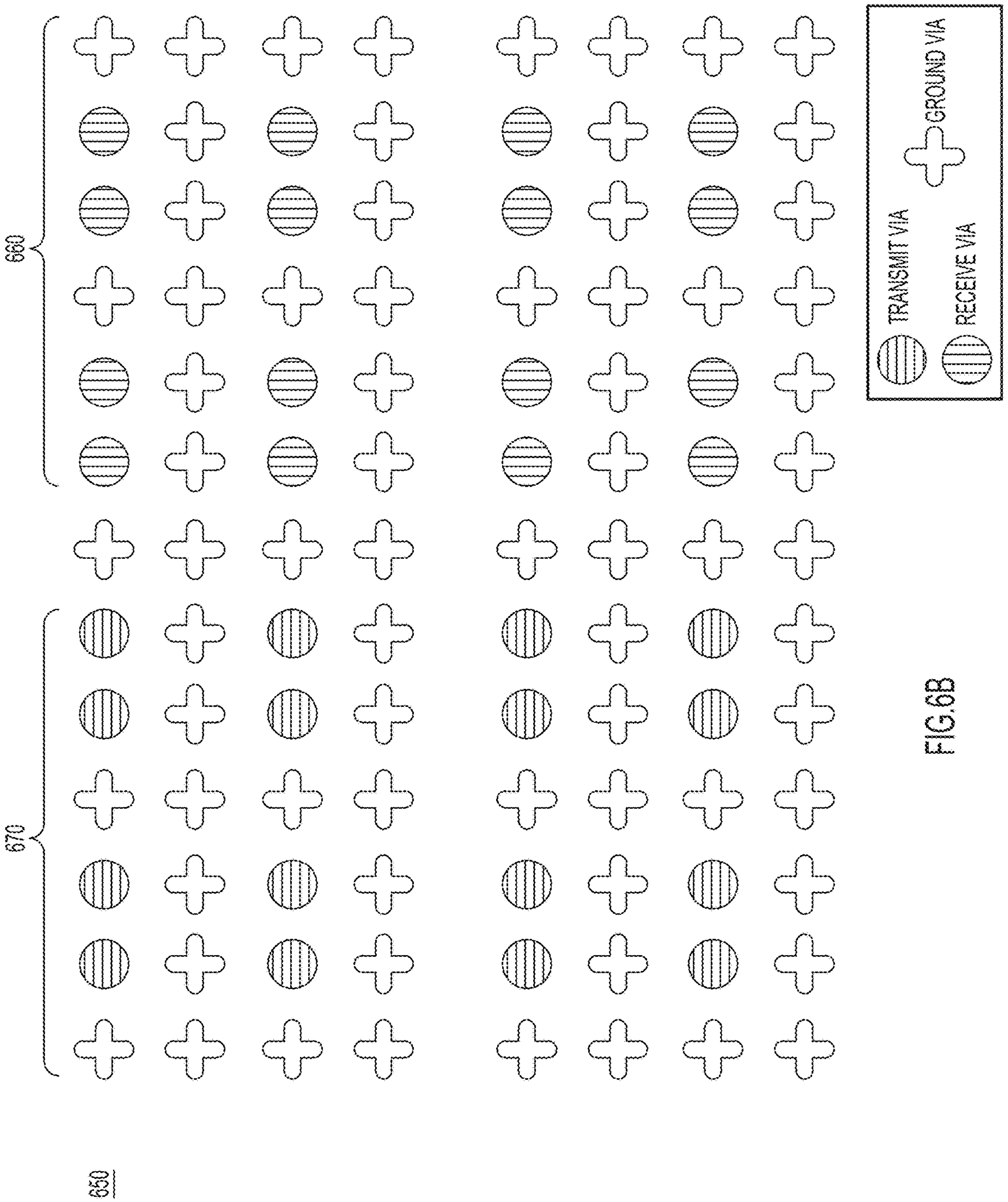
FIG. 6B is a board-to-board connector area that includes ground x-vias, according to an example embodiment.

While not illustrated in FIG. 9, flowchart 900 may include additional steps, including repeating operations 905, 910 and 915 to form the ball map pattern of FIGS. 3A and 3B, the BGA pinfield illustrated in FIG. 5B, the board-to-board connector area of FIG. 6B, the backplane connector area of FIG. 7B and/or the high speed digital change layer of FIG. 8B. Flowchart 900 may also include operations to form other structures, such as the ground pins illustrated in FIG. 8B.

In summary, the advantages of the disclosed ground x-vias include:

1. Excellent signal integrity and crosstalk performance.
2. Low cost with good signal integrity performance for 224G and 112G systems.
3. Improved routing areas for high density printed circuit board designs. Specifically, the increased isolation provided by the ground x-vias decreases the required number of ground vias opening up more space for routing.
4. Standard PCB manufacturing processes can be used. No additional effort by electrical computer-aided design engineers is needed and the same design for manufacturing/design for assembly rules apply to ground x-vias that apply to conventional circular ground via structures. Furthermore, it may not be necessary to use HDI sequential lamination techniques to implement high density/high performance designs.

Furthermore, the ground x-via structure can be used for any signal crosstalk reduction, not only for high speed differential signals. Ground x-via structures may be used for parallel bus, clock, inter-integrated circuit and other analog signal crosstalk improvement, isolation and shielding as well.

Accordingly, in some aspects, the techniques described herein relate to an apparatus including: a semiconductor device substrate material; a first signal conductor incorporated into the semiconductor device substrate material; a second signal conductor incorporated into the semiconductor device substrate material; and a ground conductor incorporated into the semiconductor device substrate material between the first signal conductor and the second signal conductor, wherein the ground conductor includes a first elongated portion and a second elongated portion arranged at an angle relative to the first elongated portion.

In some aspects, the techniques described herein relate to an apparatus, wherein the first signal conductor includes a first circular signal via and the second signal conductor includes a second circular signal conductor.

In some aspects, the techniques described herein relate to an apparatus, wherein the ground conductor includes a ground via.

In some aspects, the techniques described herein relate to an apparatus, wherein the first elongated portion and the second elongated portion form an "X" shape or a cross shape.

In some aspects, the techniques described herein relate to an apparatus, wherein the first elongated portion and the second elongated portion form an "L" shape, a "V" shape or a "T" shape.

In some aspects, the techniques described herein relate to an apparatus, wherein the first signal conductor includes a first signal via of a first differential pair of signal vias and the second signal conductor includes a first signal via of a second differential pair of signal vias.

In some aspects, the techniques described herein relate to an apparatus, wherein the apparatus includes a ball grid array.

In some aspects, the techniques described herein relate to an apparatus, wherein the apparatus includes a board-to-board connection area of a printed circuit board.

In some aspects, the techniques described herein relate to an apparatus, wherein the apparatus includes a backplane connector area of a printed circuit board.

In some aspects, the techniques described herein relate to an apparatus, wherein the apparatus includes a high speed digital change layer.

In some aspects, the techniques described herein relate to a method including: forming a first signal conductor in a semiconductor device substrate material; forming a second signal conductor in the semiconductor device substrate material; and forming, in the semiconductor device substrate material, a ground structure between the first signal conductor and the second signal conductor, wherein the ground structure includes a first elongated portion and a second elongated portion arranged at an angle relative to the first elongated portion.

In some aspects, the techniques described herein relate to a method, wherein forming the ground structure includes drilling the first elongated portion in the semiconductor device substrate material and drilling the second elongated portion in the semiconductor device substrate material.

In some aspects, the techniques described herein relate to a method, wherein forming the first signal conductor includes forming a first circular via in the semiconductor device substrate material, and wherein forming the second signal conductor includes forming a second circular via in the semiconductor device substrate material.

In some aspects, the techniques described herein relate to a method, wherein forming the ground structure includes forming the first elongated portion and the second elongated portion in an "X" shape or a cross shape.

In some aspects, the techniques described herein relate to a method, wherein forming the ground structure includes forming the first elongated portion and the second elongated portion in an "L" shape, a "V" shape or a "T" shape.

In some aspects, the techniques described herein relate to an apparatus including: a semiconductor device substrate material, and a repeating pattern formed in the semiconductor device substrate material, wherein the repeating pattern includes at least one signal conductor and at least one ground conductor, wherein the at least one ground conductor includes a first elongated portion and a second elongated portion arranged at an angle relative to the first elongated portion.

In some aspects, the techniques described herein relate to an apparatus, wherein the at least one signal conductor includes a circular via.

In some aspects, the techniques described herein relate to an apparatus, wherein the repeating pattern forms a ball grid array pinfield.

In some aspects, the techniques described herein relate to an apparatus, wherein the repeating pattern forms a board-to-board connector area or a backplane connector area of a printed circuit board.

In some aspects, the techniques described herein relate to an apparatus, wherein the repeating pattern forms a high speed digital change layer.

Variations and Implementations

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. An apparatus comprising:

a semiconductor device substrate material;

a first signal conductor incorporated into the semiconductor device substrate material;

a second signal conductor incorporated into the semiconductor device substrate material immediately adjacent to the first signal conductor;

a third signal conductor incorporated into the semiconductor device substrate material immediately adjacent to the first signal conductor;

a first ground conductor incorporated into the semiconductor device substrate material between the first signal conductor and the second signal conductor, wherein the first ground conductor comprises a first elongated portion and a second elongated portion arranged at an angle relative to the first elongated portion, and the first elongated portion extends along an axis that is collinear to the first signal conductor, the second signal conductor, and the third signal conductor; and a second ground conductor incorporated into the semiconductor device substrate material between the first signal conductor and the third signal conductor, wherein the second ground conductor comprises a third elongated portion and a fourth elongated portion arranged at an additional angle relative to the third elongated portion, and the third elongated portion extends along the axis that is collinear to the first signal conductor, the second signal conductor, and the third signal conductor.

2. The apparatus of claim 1, wherein the first signal conductor comprises a first circular signal via and the second signal conductor comprises a second circular signal conductor.

3. The apparatus of claim 1, wherein the first ground conductor comprises a ground via.

4. The apparatus of claim 1, wherein the first elongated portion and the second elongated portion form an "X" shape or a cross shape.

5. The apparatus of claim 1, wherein the first elongated portion and the second elongated portion form an "L" shape, a "V" shape or a "T" shape.

6. The apparatus of claim 1, wherein the first signal conductor comprises a first signal via of a first differential pair of signal vias and the second signal conductor comprises a second signal via of a second differential pair of signal vias.

7. The apparatus of claim 1, wherein the apparatus comprises a ball grid array.

8. The apparatus of claim 1, wherein the apparatus comprises a board-to-board connection area of a printed circuit board.

9. The apparatus of claim 1, wherein the apparatus comprises a backplane connector area of a printed circuit board.

10. The apparatus of claim 1, wherein the apparatus comprises a high speed digital change layer.

11. An apparatus comprising:

a semiconductor device substrate material, and a repeating pattern formed in the semiconductor device substrate material, wherein the repeating pattern comprises a plurality of signal conductors and a plurality of ground conductors alternately interleaved with one another, wherein each ground conductor of the plurality of ground conductors comprises a first elongated portion and a second elongated portion arranged at an angle relative to the first elongated portion, the first elongated portion of each ground conductor extends along a first axis to be collinear to one another, and signal conductors of the plurality of signal conductors are positioned along a second axis to be collinear to one another.

12. The apparatus of claim 11, wherein the plurality of signal conductors comprises a circular via.

13. The apparatus of claim 11, wherein the repeating pattern forms a ball grid array pinfield.

14. The apparatus of claim 11, wherein the repeating pattern forms a board-to-board connector area or a backplane connector area of a printed circuit board.

15. The apparatus of claim 11, wherein the repeating pattern forms a high speed digital change layer.

16. The apparatus of claim 11, wherein the angle at which the second elongated portion is arranged relative to the first elongated portion is a right angle.

17. The apparatus of claim 11, wherein the angle at which the second elongated portion is arranged relative to the first elongated portion is an oblique angle.

18. The apparatus of claim 17, wherein the oblique angle is an acute angle.

19. The apparatus of claim 11, wherein a first end of the first elongated portion intersects a second end of the second elongated portion.

20. The apparatus of claim 11, wherein a first midpoint of the first elongated portion intersects a second midpoint of the second elongated portion.

* * * * *